(12) United States Patent
Shang et al.

(10) Patent No.: US 11,880,585 B2
(45) Date of Patent: Jan. 23, 2024

(54) SEMICONDUCTOR MEMORY AND METHOD FOR WRITING DATA

(71) Applicant: CHANGXIN MEMORY TECHNOLOGIES, INC., Hefei (CN)

(72) Inventors: Weibing Shang, Hefei (CN); Hongwen Li, Hefei (CN); Kangling Ji, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 282 days.

(21) Appl. No.: 17/510,386

(22) Filed: Oct. 26, 2021

(65) Prior Publication Data

US 2022/0317919 A1 Oct. 6, 2022

Related U.S. Application Data

(63) Continuation of application No. PCT/CN2021/109090, filed on Jul. 29, 2021.

(30) Foreign Application Priority Data

Apr. 1, 2021 (CN) .......................... 202110355210.2

(51) Int. Cl.
*G06F 3/00* (2006.01)
*G06F 3/06* (2006.01)
(Continued)

(52) U.S. Cl.
CPC .......... *G06F 3/0655* (2013.01); *G06F 3/0604* (2013.01); *G06F 3/0673* (2013.01);
(Continued)

(58) Field of Classification Search
CPC ............. G06F 11/1048; G06F 11/1068; G06F 11/1012; G06F 11/108; G06F 3/0679; G06F 11/1044; G06F 11/1016; G06F 11/1076; G06F 12/121; G06F 3/0659; G06F 11/1032; G06F 13/1668; G06F 21/554; G06F 3/0619; G06F 11/10; G06F 11/1666; G06F 2201/805; G06F 3/0604; G06F 12/0246; G06F 13/4059; G06F 3/0655; G06F 11/07; G06F 11/1008; G06F 3/064; G11C 29/52; G11C 11/4096; G11C 29/42;
(Continued)

(56) References Cited

U.S. PATENT DOCUMENTS 7,216,198 B2 5/2007 Ito et al.
2020/0371869 A1* 11/2020 Park ...................... G06F 12/121

* cited by examiner

*Primary Examiner* — Thong Q Le
(74) *Attorney, Agent, or Firm* — Kilpatrick Townsend & Stockton LLP

(57) ABSTRACT

Embodiments relate to a semiconductor memory and a method for writing data. The semiconductor memory includes: at least one storage array, the storage array including a plurality of data storage units and a plurality of check bit storage units; a check module, configured to receive written data and generate check data according to the written data; and a data transmission module, respectively connected to the check module and the storage array, the data transmission module being configured to transmit the written data to the plurality of data storage units and transmit the check data to the plurality of check bit storage units. A first transmission time duration of the check data is shorter than a second transmission time duration of the written data.

17 Claims, 5 Drawing Sheets

(51) Int. Cl.
*G11C 11/4076* (2006.01)
*G11C 11/4091* (2006.01)
*G11C 7/10* (2006.01)

(52) U.S. Cl.
CPC ........ *G11C 7/1006* (2013.01); *G11C 11/4076* (2013.01); *G11C 11/4091* (2013.01)

(58) Field of Classification Search
CPC . G11C 2029/0411; G11C 5/04; G11C 11/407; G11C 11/4093; G11C 11/401; G11C 2029/0401; G11C 2029/0409; G11C 29/74; G11C 7/1006; G11C 16/08; G11C 2213/71; G11C 29/44; G11C 11/406; G11C 11/408; G11C 29/26; H01L 2225/06513; H01L 2225/06541; H01L 25/0657; H01L 2224/13025; H01L 2224/16146; H01L 2224/16227; H01L 2224/1703; H01L 2224/17181; H01L 2225/06517; H01L 2225/06568; H01L 24/13; H01L 24/16; H01L 24/17; H01L 25/18; H01L 2924/15311; H03M 13/1575; H03M 13/19; H03M 13/3746; H03M 13/2906

See application file for complete search history.

SEMICONDUCTOR MEMORY AND METHOD FOR WRITING DATA

CROSS-REFERENCE TO RELATED APPLICATION

This application is a continuation of PCT/CN2021/109090, filed on Jul. 29, 2021, which claims priority to Chinese Patent Application No. 2021103552102 titled "SEMICONDUCTOR MEMORY AND METHOD FOR WRITING DATA" and filed to the State Intellectual Property Office on Apr. 1, 2021, the entire contents of which are incorporated herein by reference.

TECHNICAL FIELD

Embodiments of the present disclosure relate to the field of memory technologies, and more particularly, to a semiconductor memory and a method for writing data.

BACKGROUND

As a memory that uses semiconductor circuits for access, a semiconductor memory particularly a dynamic random access memory (DRAM) is widely used in various fields due to its fast storage speed and high integration. To obtain higher data read/write reliability, it is necessary to provide a check module in the semiconductor memory to check whether read data are accurate. However, the introduction of the check module may slow down read/write speed of the memory and have a negative effect on performance of the semiconductor memory.

SUMMARY

An embodiment of the present disclosure provides semiconductor memory, which includes:

at least one storage array, the storage array comprising a plurality of data storage units and a plurality of check bit storage units;

a check module, configured to receive written data and generate check data according to the written data; and a data transmission module, respectively connected to the check module and the storage array, the data transmission module being configured to transmit the written data to the plurality of data storage units and transmit the check data to the plurality of check bit storage units.

A first transmission time duration of the check data is shorter than a second transmission time duration of the written data, wherein the first transmission time duration is a time duration required for transmitting the check data from the data transmission module to the check bit storage unit, and the second transmission time duration is a time duration required for transmitting the written data from the data transmission module to the data storage unit.

An embodiment of the present disclosure also provides an method for writing data, which includes:

obtaining written data, and transmitting the written data to a check module;

transmitting the written data to a data storage unit via a data transmission module, the data transmission module being respectively connected to the check module and the data storage unit; and generating check data according to the written data, and transmitting the check data to a check bit storage unit, the data transmission module being respectively connected to the check bit storage unit.

A first transmission time duration of the check data is shorter than a second transmission time duration of the written data, wherein the first transmission time duration is a time duration required for transmitting the check data from the data transmission module to the check bit storage unit, and the second transmission time duration is a time duration required for transmitting the written data from the data transmission module to the data storage unit.

Embodiments of the present disclosure relate to a semiconductor memory and a method for writing data. The semiconductor memory includes: at least one storage array, the storage array including a plurality of data storage units and a plurality of check bit storage units; a check module, configured to receive written data and generate check data according to the written data; and a data transmission module, respectively connected to the check module and the storage array, the data transmission module being configured to transmit the written data to the plurality of data storage units and transmit the check data to the plurality of check bit storage units. A first transmission time duration of the check data is shorter than a second transmission time duration of the written data, wherein the first transmission time duration is a time duration required for transmitting the check data from the data transmission module to the plurality of check bit storage units, and the second transmission time duration is a time duration required for transmitting the written data from the data transmission module to the plurality of data storage units. In the embodiments of the present disclosure, by adjusting the first transmission time duration and/or the second transmission time duration to make the first transmission time duration shorter, the time duration spent by the check module in generating the check data can be effectively compensated for, such that sum of a time duration for generation of the check data and the first transmission time duration matches the second transmission time duration. In this way, synchronization of writing different data can be improved, data writing speed can be increased, and thus performance of the memory can be improved.

BRIEF DESCRIPTION OF THE DRAWINGS

To describe the technical solutions in the embodiments of the present disclosure or the existing technologies more clearly, the accompanying drawings required for describing the embodiments or the existing technologies will be briefly introduced below. Apparently, the accompanying drawings in the following description are merely some embodiments of the present disclosure. To those of ordinary skills in the art, other accompanying drawings may also be derived from these accompanying drawings without creative efforts.

Figure 1:
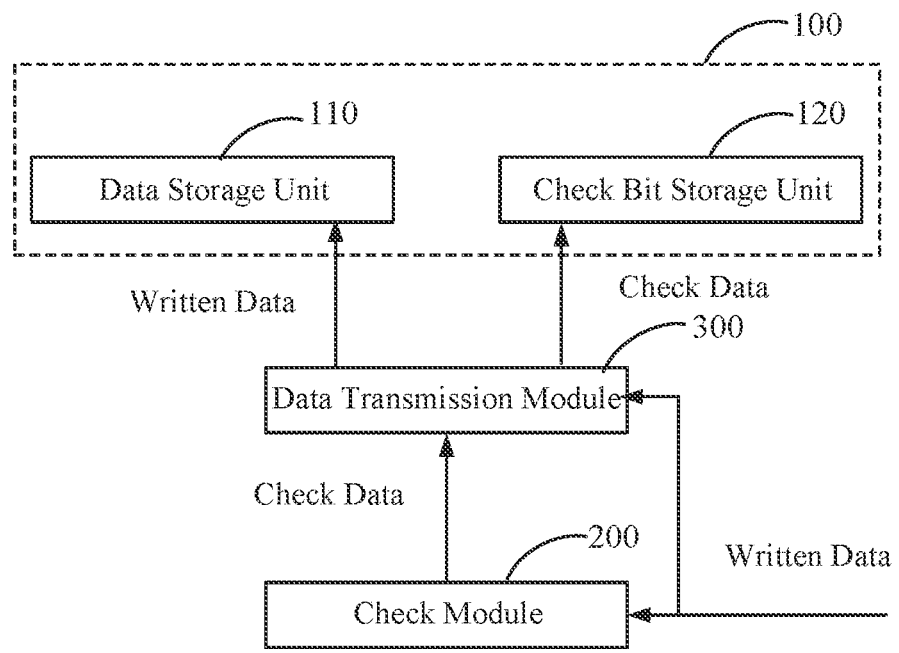
FIG. 1 is a schematic structural diagram I of a semiconductor memory according to an embodiment.

REFERENCE NUMERALS OF COMPONENTS storage array: 100; data storage unit: 110; check digit storage unit: 120; check module: 200; first check unit: 210;

second check unit: 220; data transmission module: 300; first transmission unit: 310; second transmission unit: 320; bit line pair: 410; sense amplifier: 420; local data line pair: 430; read-write conversion circuit: 440; global data line pair: 450; column decoding circuit: 510; and row decoding circuit: 520.

DETAILED DESCRIPTION

For ease of understanding the embodiments of the present disclosure, the present disclosure will be described more fully hereinafter with reference to the accompanying drawings. Some embodiments among the embodiments of the present disclosure are provided in the accompanying drawings. However, the embodiments of the present disclosure may be embodied in many different forms and should not be limited to the embodiments set forth herein. Rather, these embodiments are provided so that contents disclosed in the embodiments of the present disclosure will be more thorough and complete.

Unless otherwise defined, all technical and scientific terms employed herein have the same meaning as commonly understood by one of ordinary skill in the art to which the present disclosure belongs. The terms employed in the specification of the embodiments of the present disclosure are merely for the purpose of describing some embodiments and are not intended for limiting the embodiments of the present disclosure. As used herein, the term "and/or" includes any and all combinations of one or more of the associated listed items.

In the description of the embodiments of the present disclosure, it is to be understood that the orientations or positions represented by the terms of "up", "down", "vertical", "horizontal", "in", "out", and the like are based on the orientations or positions as shown in the accompanying figures, they are merely for ease of a description of the embodiments of the present disclosure and a simplified description instead of being intended to indicate or imply the device or element to have a special orientation or to be configured and operated in a special orientation. Thus, they cannot be interpreted as limiting of the embodiments of the present disclosure.

It is to be understood that the terms "first", "second", etc. used in the present disclosure may be used herein to describe various elements, but these elements are not limited by these terms. These terms are only used to distinguish a first element from another one. For example, without departing from the scope of the present disclosure, a first bit line may be referred to as a second bit line, and similarly, the second bit line may be referred to as the first bit line. Both the first bit line and the second bit line are bit lines, but they are not the same bit line.

In addition, terms "first" and "second" are used only for purposes of description and are not intended to indicate or imply relative importance or to imply the number of indicated technical features. Thus, the feature defined with "first" and "second" may explicitly or implicitly include at least one such feature. In the description of the present disclosure, "a plurality of" refers to at least two, for example, two, three, etc., unless otherwise expressly specified. In the description of the present disclosure, "a number of" refers to at least one, for example, one, two, etc., unless otherwise expressly specified.

FIG. 1 is a schematic structural diagram I of a semiconductor memory according to an embodiment. Referring to FIG. 1, in this embodiment, the semiconductor memory includes a check module, a data transmission module 300, and at least one storage array 100.

The check module is configured to receive written data and generate check data according to the written data. The check data are generated and saved in a data-writing phase to determine whether an error occurs in a data-reading phase. That is, it is determined whether an error occurs in a data read/write process by determining whether data read from a data storage unit 110 are the same as the written data. The check module may be configured to check data information of a plurality of storage arrays 100, to implement optimization of number of check modules, and thus providing a small-sized semiconductor memory. It is to be understood that the check module may be any circuit structure having the function of generating the check data. This embodiment does not limit a type of the check module, which may have at least one of a parity check function and an error correction check function, etc.

The storage array 100 includes a plurality of data storage units 110 and a plurality of check bit storage units 120, wherein the plurality of storage units are configured to store data, and thus to implement the storage function of the semiconductor memory. The plurality of data storage units 110 are configured to store the written data inputted from outside to the memory, and the plurality of check bit storage units 120 are configured to store the check data generated according to the written data. In some embodiments, each of the plurality of storage units further includes a storage capacitor and a transistor, wherein a control terminal of the transistor is connected to a word line, a first terminal of the transistor is connected to the storage capacitor, and a second terminal of the transistor is connected to a bit line. When the word line controls the transistor to be enabled, conduction between the storage capacitor and the bit line is enabled, to implement read-write of data information. That is, when the data information is read, the storage capacitor transmits the stored data information to the bit line; and when the data information is written, the bit line transmits the data information to be written to the storage capacitor.

The data transmission module 300 is respectively connected to the check module and the storage array 100, and is configured to transmit the written data to the plurality of data storage units 110 and transmit the check data to the plurality of check bit storage units 120. A first transmission time duration of the check data is shorter than a second transmission time duration of the written data, wherein the first transmission time duration is a time duration required for transmitting the check data from the data transmission module 300 to the plurality of check bit storage units 120, and the second transmission time duration is a time duration required for transmitting the written data from the data transmission module 300 to the plurality of data storage units 110. The written data can be directly written into the plurality of data storage units 110 by means of the data transmission module 300, but the check data need to be generated by the check module based on the written data. Therefore, the check data arrive at the data transmission module 300 later than the written data. Correspondingly, a moment at which the check data are written into the plurality of check bit storage units 120 is slightly later than a moment at which the written data are written into the plurality of data storage units 110, resulting in poor data write synchronization, and thus increasing write speed. In this embodiment, by shortening the first transmission time duration and/or extending the second transmission time duration, the aforementioned synchronization problem can be effectively compensated for. It is to be understood that the data transmission module 300 can implement the foregoing transmission time duration by controlling at least one of a path length of data transmission, a trigger moment of data transmission, a speed of data transmission, and the like. This embodiment does not limit an implementation of allowing the first transmission time duration to be less than the second transmission time duration.

In this embodiment, the semiconductor memory includes: at least one storage array 100, the storage array 100 including a plurality of data storage units 110 and a plurality of check bit storage units 120; a check module, configured to receive written data and generate check data according to the written data; and a data transmission module 300, respectively connected to the check module and the storage array 100, wherein the data transmission module 300 is configured to transmit the written data to the plurality of data storage units 110 and transmit the check data to the plurality of check bit storage units 120. A first transmission time duration of the check data is shorter than a second transmission time duration of the written data, wherein the first transmission time duration is a time duration required for transmitting the check data from the data transmission module 300 to the plurality of check bit storage units 120, and the second transmission time duration is a time duration required for transmitting the written data from the data transmission module 300 to the plurality of data storage units 110. By adjusting the first transmission time duration and/or the second transmission time duration to make the first transmission time duration shorter, the time duration spent by the check module in generating the check data can be effectively compensated for, such that sum of a time duration for generation of the check data and the first transmission time duration matches the second transmission time duration. In this way, synchronization of writing different data can be improved, and thus reliability of data write can be improved.

In one embodiment, a first transmission path of the check data is shorter than a second transmission path of the written data, wherein the first transmission path is a path between the data transmission module 300 and each of the plurality of check bit storage units 120, and the second transmission path is a path between the data transmission module 300 and each of the plurality of data storage units 110. The first transmission path corresponds to the first transmission time duration, and the second transmission path corresponds to the second transmission time duration. A transmission speed of the written data is equal to that of the check data, which may serve as a reference, and the corresponding path length is obtained according to the transmission time duration. The above method can effectively reduce difficulty of obtaining the path length and can obtain more accurate path length information. It is to be understood that the manner of adjusting the transmission time duration by means of path length has lower design requirements, process requirements, and device performance requirements, etc. For example, if the transmission time duration is adjusted by means of controlling the trigger moment of data transmission, higher requirements are imposed on reliability and window of a clock signal. That is, the requirements for device performance are higher. That is, this embodiment provides a semiconductor memory higher in accuracy and easy for implementation.

In one embodiment, a differential between the first transmission time duration and the second transmission time duration is greater than a preset time duration, wherein the preset time duration is a time duration required by the check module to generate the check data based on the written data. In this embodiment, a corresponding time duration differential may be determined according to the manner in which the check module generates the check data. In some embodiments, if the manner of generating the check data is relatively simple, a calculation time duration of the check module is shorter. In this case, a smaller time duration differential may be set to improve operating efficiency of the memory. Moreover, if the transmission time duration is set by adjusting the path length, selecting the smaller time duration differential further has the function of shortening signal routing, which can improve signal stability and reliability of a signal transmission path. If the manner of generating the check data is relatively complicated, the calculation time duration of the check module is longer. In this case, a larger time duration differential may be set to ensure synchronization between the written data and the check data. Exemplarily, taking an example where the check module is an error correction check module, the time required for data generation is longer, which generally is 0.5 ns to 1 ns, and correspondingly, the preset time duration may be set 0.5 ns to 1 ns to ensure synchronization of the memory.

Figure 2:
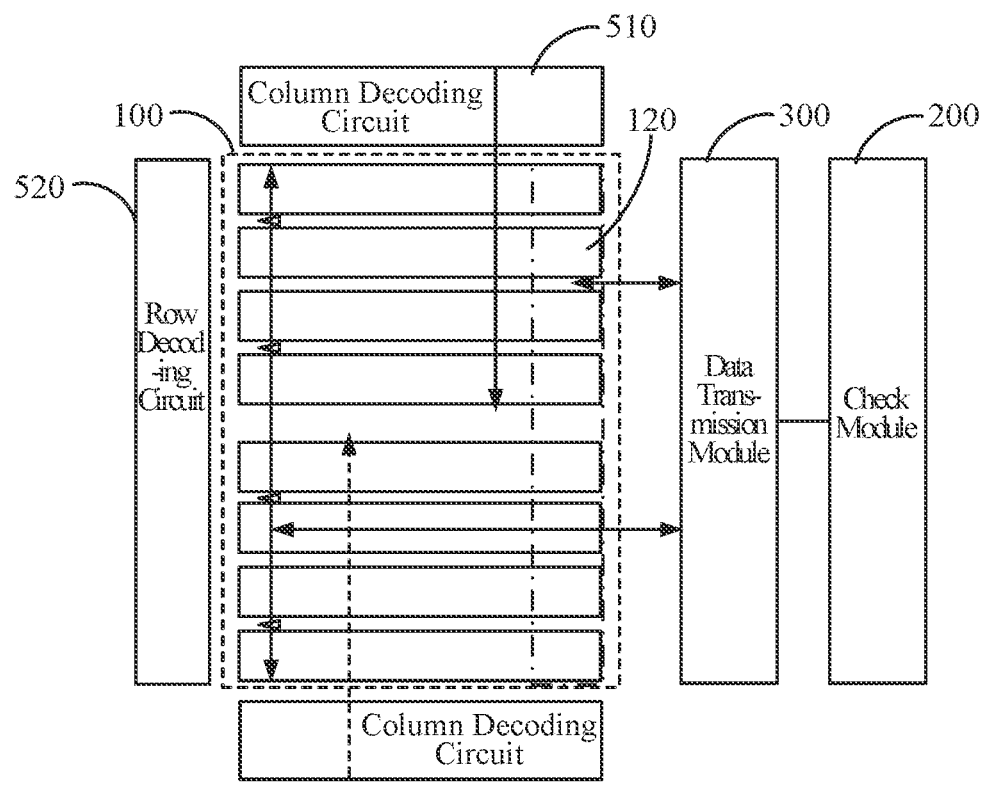
FIG. 2 is a schematic structural diagram II of a semiconductor memory according to an embodiment.

FIG. 2 is a schematic structural diagram II of a semiconductor memory according to an embodiment. Referring to FIG. 2, in this embodiment, the memory further includes a row decoding circuit 520 and at least one column decoding circuit 510. The column decoding circuit 510 is correspondingly connected to the storage array 100, and the row decoding circuit 520 is connected to the storage array 100, wherein the column decoding circuit 510 and the row decoding circuit 520 are jointly configured to decode an address signal to select the storage unit to be written. Further, the semiconductor memory may include two of the column decoding circuits 510, wherein the two column decoding circuits 510 are correspondingly connected to the same storage array 100, and the two column decoding circuits 510 are arranged, opposite to each other, on two sides of the storage array 100 along an extension direction of the bit line.

In this embodiment, the storage cells within a dot dash line region on the right side of the storage array 100 may serve as the plurality of check bit storage units 120, and the remaining storage units in the storage array 100 may serve as the plurality of data storage units 110. A quantitative relationship between the plurality of check bit storage units 120 and the plurality of data storage units 110 may be determined according to a check manner of the check module. For example, if the check module generates 1-bit check data based on 8-bit written data, the number of the check bit storage units 120 may be one eighth of that of the data storage units 110. In this embodiment, the plurality of check bit storage units 120 are arranged at a location closer to the data transmission module 300, such that the check data in the storage array 100 have the shortest transmission path and the lightest load, thereby effectively compensating for delay of a preceding stage of the check data in a check operation. Moreover, with reference to FIG. 2, it may be found that a process of data transmitted from the data transmission module 300 to the storage unit is a T-shaped data transmission structure. The T-shaped structure is relatively flexible and fast, and can effectively optimize area and performance of the memory.

Figure 3:
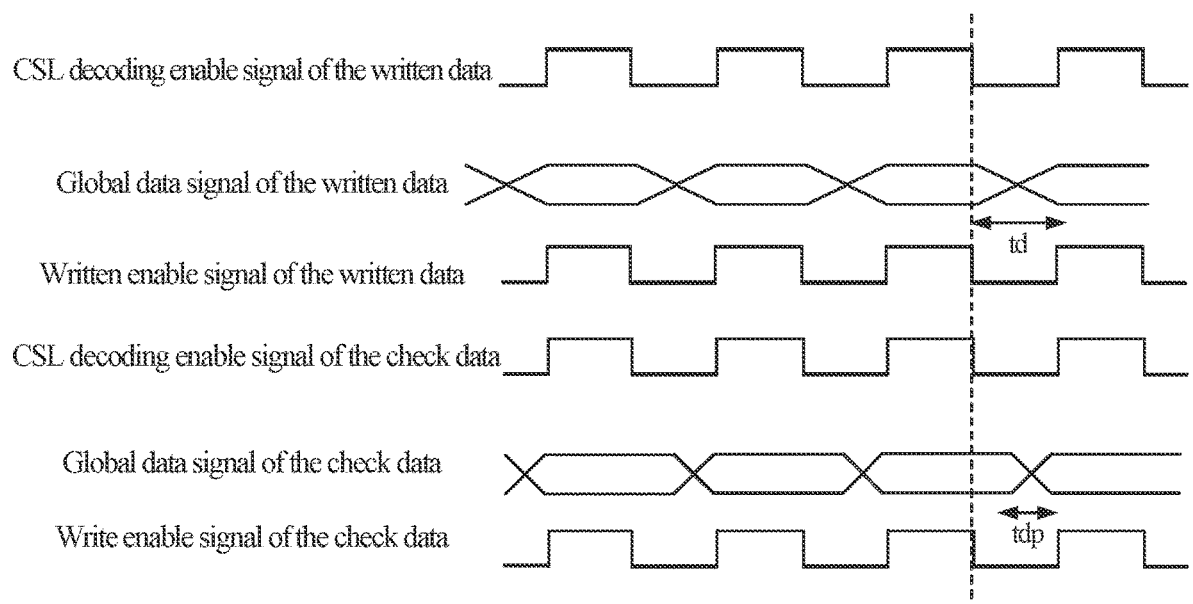
FIG. 3 is a timing diagram of a write operation of a semiconductor memory according to an embodiment.

FIG. 3 is a timing diagram of a write operation of a semiconductor memory according to an embodiment, wherein the timing diagram in FIG. 3 may be implemented based on the semiconductor memory provided by the embodiment in FIG. 2. Referring to FIG. 3, in this embodiment, an enable signal of the written data and an enable signal of the check may be further separated for control. In some embodiments, this means that a CSL decoding enable signal and a write enable signal are separated from each other, to achieve the objective of balancing two-way speed and improving control flexibility of a sequence signal. As can be found from FIG. 3, although the moments when the two data starting to be written are not the same, by adjusting the transmission time duration, a response time duration tdp of a global data line for the check data may be less than a response time duration td of the global data line for the written data, and the check data and the written data may be written at a similar moment. In this way, the synchronization of data writing is effectively improved, and thus write performance of the semiconductor memory is improved.

Figure 4:
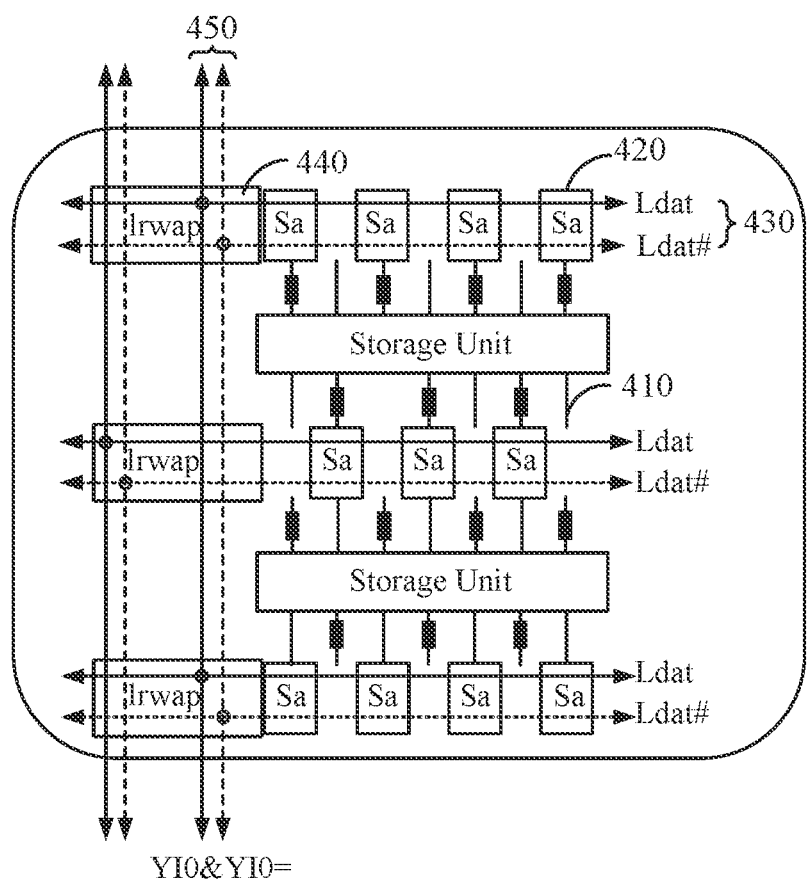
FIG. 4 is a partial enlarged view of the semiconductor memory according to the embodiment in FIG. 2.

FIG. 4 is a partial enlarged view of the semiconductor memory according to the embodiment in FIG. 2. Referring to FIG. 4, in this embodiment, the memory also includes a plurality of bit line pairs 410, a plurality of local data line pairs 430, and a plurality of sense amplifiers 420. Furthermore, the above structure can be configured to transmit a written data signal and a check data signal. Therefore, the above structure may also be interpreted as a portion of the data transmission module 300.

Each of the plurality of bit line pairs 410 comprises a first bit line and a second bit line, wherein the first bit line and the second bit line are configured to transmit opposite signals, and the plurality of storage units positioned in the same column are connected to the same one of the plurality of bit line pairs 410. In this embodiment, a signal transmitted by the first bit line may be the same as actual data, and a signal transmitted by the second bit line may be opposite to the actual data. By transmitting the same data by means of two signal lines with opposite transmission signals, reliability in the data transmission process can be effectively improved. In other embodiments, line pairs of two-line transmission also have the above-mentioned functions. It is to be noted that to simplify the accompanying drawings, the plurality of bit line pairs 410 are shown only by means of a single-line structure in FIG. 4. Each of the plurality of local data line pairs 430 comprises a first local data line Ldat and a second local data line Ldat #, and the first local data line Ldat and the second local data line Ldat # are configured to transmit opposite signals. Each of the plurality of sense amplifiers 420 is respectively connected to one of the plurality of bit line pairs 410 and one of the plurality of local data line pairs 430, wherein the two storage units positioned in the adjacent columns are respectively connected to different local data line pairs 430 among the plurality of local data line pairs 430 via a corresponding one of the plurality of bit line pairs 410 and a corresponding one of the plurality of sense amplifiers 420.

Further, with continued reference to FIG. 4, the memory further includes a plurality of global data line pairs 450 and a plurality of read-write conversion circuits 440. Similar to the foregoing contents, the above-mentioned structure may also be interpreted as a portion of the data transmission module 300.

Each of the plurality of global data line pairs 450 comprises a first global data line YIO and a second global data line YIO #, and each of the plurality of global data line pairs 450 respectively corresponds to the plurality of local data line pairs 430. Each check module is connected to a set of global data line pairs 450, and the check module may transmit or receive the data information by means of the plurality of global data line pairs 450. Each of the plurality of read-write conversion circuits 440 is respectively connected to the plurality of global data line pairs 450 and one of the plurality of local data line pairs 430, wherein the plurality of read-write conversion circuits 440 are configured to convert a data transmission direction between the plurality of global data line pairs 450 and the plurality of local data line pairs 430.

In some embodiments, when data in the storage unit need to be changed or rewritten, the column decoding circuit 510 selects a corresponding sense amplifier 420, and the data are transmitted from the global data line pair 450 to the local data line pair 430 by means of the local read-write conversion circuit 440 (lrwap). Next, the data are written into the corresponding sense amplifier 420, and then are transmitted to the connected storage unit by means of the bit line pair 410. When the data are read, directions of data transmission are opposite. The column decoding circuit 510 selects the location of the corresponding sense amplifier 420, and the data are transmitted to the local data line pair 430 by means of the bit line pair 410 and the sense amplifier 420. Next, the data are transmitted to the global data line pair 450 by means of the local read-write conversion circuit 440 (lrwap), and finally the data are amplified and outputted by means of a second sense amplifier (SSA).

In one embodiment, the check data include error correction check data, the written data and the error correction check data both include a plurality of data bits, and number of the data bits of the written data is large than that of the data bits of the error correction check data. The check module includes an error correction check unit, which is connected to the data transmission module 300 and is configured to generate the error correction check data according to the written data. Data of one of the plurality of data bits are correspondingly stored in one of the plurality of data storage units 110 or one of the plurality of check bit storage units 120. A transmission time duration required for the written data, configured for defining each of the plurality of data bits, to be transmitted from the data transmission module 300 to a corresponding one of the plurality of data storage units 110 is a data transmission time duration. A transmission time duration required for the error correction check data, configured for defining each of the plurality of data bits, to be transmitted from the data transmission module 300 to a corresponding one of the plurality of check bit storage units 120 is a check transmission time duration. In this embodiment, the error correction check module may be configured to detect and/or correct errors in the data storage or transmission process, to improve the reliability of the memory.

For example, the first transmission time duration is the maximum one of the plurality of check transmission time durations, and the second transmission time duration is the minimum one of the plurality of data transmission time durations. Based on the above method, it can be the most effectively ensured that all the check data can be accurately written. That is, a memory with a higher accuracy is provided. For another example, the first transmission time duration is the maximum one of the plurality of check transmission time durations, and the second transmission time duration is the maximum one of the plurality of data transmission time durations. Based on the above method, a negative effect on the data storage speed can be avoided to a greater degree. For still another example, the first transmission time duration is a mean value among the plurality of check transmission time durations, and the second transmission time duration is a mean value among of the plurality of data transmission time durations. Based on the above method, the plurality of performance parameters mentioned above may be more effectively balanced. That is, a memory with more balanced performance is provided.

Figure 5:
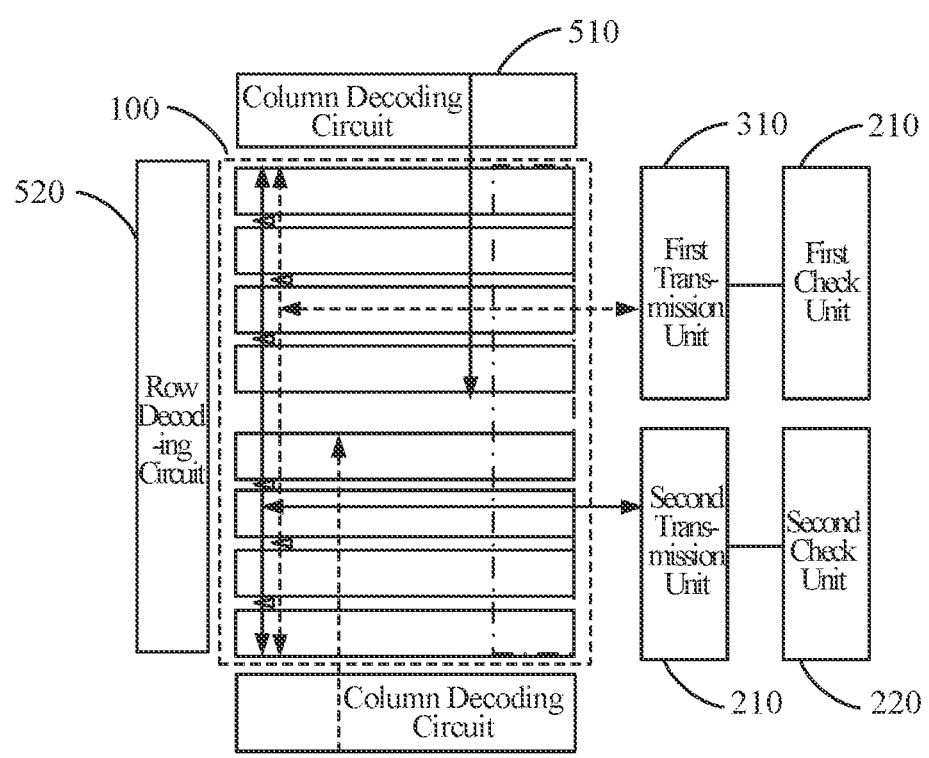
FIG. 5 is a schematic structural diagram III of a semiconductor memory according to an embodiment.

FIG. 5 is a schematic structural diagram III of a semiconductor memory according to an embodiment. Referring to FIG. 5, in this embodiment, the check module includes a first check unit 210 and a second check unit 220, and the data transmission module 300 includes a first transmission unit 310 and a second transmission unit 320. One of two of the plurality of storage units positioned in adjacent columns is connected to the first check unit 210 via the first transmission unit 310, and the other one of two of the plurality of storage units is connected to the second check unit 220 via the second transmission unit 320. Exemplarily, for the check module including the error correction check unit, the first check unit 210 may be interpreted as a first error correction check unit, and the second check unit 220 may be interpreted as a second error correction check unit. That is, a type of the check module does not conflict with the number of check units.

It is to be understood that for the memory, due to the manufacturing process, when an exception occurs in one of the plurality of storage units, a probability of occurrence of an exception in adjacent storage units is higher than that of other storage units. Therefore, in this embodiment, by ensuring that data corresponding to the adjacent bit line pairs 410 respectively correspond to different check units, detection efficiency can be effectively improved. Particularly for the error correction check unit, the data stored in exceptional storage units positioned in the adjacent columns may be separately corrected by the first check unit 210 and the second check unit 220 in one-to-one correspondence, to achieve capability of repairing two errors at the same time (assuming that each check unit can only repair one error).

In one embodiment, the check data include parity check data, the written data include a plurality of data bits, the parity check data include one data bit, and the check module includes a parity check unit. The parity check unit is connected to the data transmission module 300, and is configured to generate the parity check data according to the written data. Data of one of the plurality of data bits are correspondingly stored in one of the plurality of data storage units 110 or one of the plurality of check bit storage units 120. A transmission time duration required for the written data, configured for defining each of the plurality of data bits, to be transmitted from the data transmission module 300 to a corresponding one of the plurality of data storage units 110 is a data transmission time duration. A transmission time duration required for defining the parity check data to be transmitted from the data transmission module 300 to a corresponding one of the plurality of check bit storage units 120 is a check transmission time duration. In this embodiment, the parity check unit has simple operation logic, and can generate the check data quickly. Therefore, a user may select to provide at least one of the error correction check unit and the parity check unit in the check module as needed.

For example, the first transmission time duration is the check transmission time duration, and the second transmission time duration is the minimum one of the plurality of data transmission time durations. Based on the above method, it can be the most effectively ensured that all the check data can be accurately written. That is, a memory with a higher accuracy is provided. For another example, the second transmission time duration is the maximum one of the plurality of data transmission time durations. Based on the above method, a negative effect on the data storage speed can be avoided to a greater degree. For still another example, the second transmission time duration is a mean value among of the plurality of data transmission time durations. Based on the above method, the plurality of performance parameters mentioned above may be more effectively balanced. That is, a memory with more balanced performance is provided.

Figure 6:
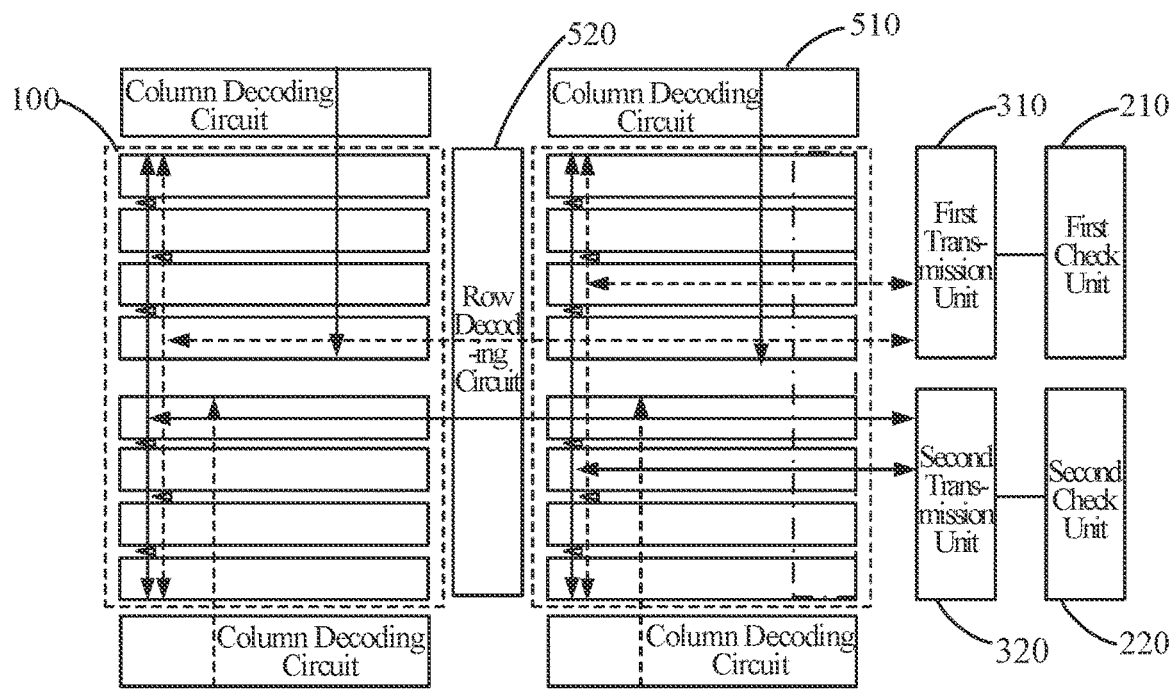
FIG. 6 is a schematic structural diagram IV of a semiconductor memory according to an embodiment.

FIG. 6 is a schematic structural diagram IV of a semiconductor memory according to an embodiment. Referring to FIG. 6, in this embodiment, the semiconductor memory includes two storage arrays 100. In some embodiments, when the semiconductor memory includes two storage arrays 100, the check bit storage unit may be provided in only one of the two storage arrays 100. That is, as shown in FIG. 6, the storage array 100 on the left side (i.e., the storage array 100 far from the transmission unit) only includes the data storage unit 110, and the storage array 100 on the right side (i.e., the storage array 100 far from the transmission unit) includes the data storage unit 110 and the check bit storage unit 120. Exemplarily, the storage array 100 close to the data transmission module 300 may be configured to store 128 bits of written data and 16 bits of check data, and the storage array 100 far away from the data transmission module 300 may be configured to store 128 bits of written data. The memory with the above-mentioned parameter settings has a relatively balanced demand for drive capability and write speed, and thus its performance is relatively stable.

Further, the two storage arrays 100 may be connected to the same row decoding circuit 520 to reduce the number of row decoding circuits 520 that need to be provided, such that a small-sized memory can be provided. In some embodiments, the data transmission module 300 may synchronously transmit the written data to the two storage arrays 100 to increase the data write speed; and the data transmission module 300 may also asynchronously transmit the written data to the two storage arrays 100 to improve stability and reliability of data transmission.

Figure 7:
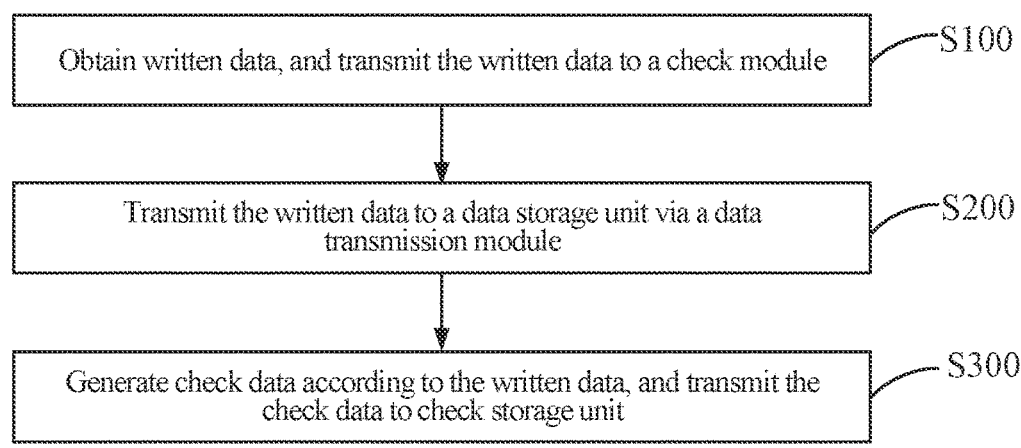
FIG. 7 is a flowchart of a method for writing data according to an embodiment.

FIG. 7 is a flowchart of a method for writing data according to an embodiment. Referring to FIG. 7, in this embodiment, the method for writing data includes Steps S100 to S300.

Step S100: obtaining written data, and transmitting the written data to a check module;

Step S200: transmitting the written data to a data storage unit 110 via a data transmission module 300, wherein the data transmission module 300 is respectively connected to the check module and the data storage unit 110; and Step S300: generating check data according to the written data, and transmitting the check data to a check bit storage unit 120, wherein the data transmission module 300 is respectively connected to the check bit storage unit 120.

A first transmission time duration of the check data is shorter than a second transmission time duration of the written data, wherein the first transmission time duration is a time duration required for transmitting the check data from the data transmission module 300 to the plurality of check bit storage units 120, and the second transmission time duration is a time duration required for transmitting the written data from the data transmission module 300 to the plurality of data storage units 110. In this embodiment, based on the above steps, synchronization of writing the written data and the check data can be improved, and write speed can be improved. That is, a method for writing data with better data write performance is provided. It is to be understood that reference may be made to the implementations of the aforementioned semiconductor memory for further limitation on this embodiment, which is not to be repeated here.

It is to be understood that although the various steps in the flowchart of FIG. 7 are displayed in sequence as indicated by the arrows, these steps are not necessarily performed in sequence in the order indicated by the arrows. It should be understood that unless expressly stated herein, the execution of these steps is not strictly limited in sequence, and these steps may be performed in other orders. Moreover, at least some of the steps in FIG. 7 may include a plurality of sub-steps or a plurality of stages, which are not necessarily performed at the same moment, but may be executed at different moments, and the order of execution of these sub-steps or stages is not necessarily performed sequentially, but may be performed alternately or alternately with at least a portion of the sub-steps or stages of other steps or other steps.

Technical features of the above embodiments may be arbitrarily combined. For simplicity, all possible combinations of the technical features in the above embodiments are not described. However, as long as the combination of these technical features is not contradictory, it shall be deemed to be within the scope recorded in this specification.

The above embodiments merely express a plurality of implementations of the embodiments of the present disclosure, and descriptions thereof are relatively concrete and detailed. However, these embodiments are not thus construed as limiting the patent scope of the present disclosure. It is to be pointed out that for persons of ordinary skill in the art, some modifications and improvements may be made under the premise of not departing from a conception of the embodiments of the present disclosure, which shall be regarded as falling within the scope of protection of the embodiments of the present disclosure. Thus, the scope of protection of the embodiments of the present disclosure shall be subject to the appended claims.

What is claimed is:

1. A semiconductor memory, comprising:
   at least one storage array, the storage array comprising a plurality of data storage units and a plurality of check bit storage units;
   a check module, configured to receive written data and generate check data according to the written data; and
   a data transmission module, respectively connected to the check module and the at least one storage array, the data transmission module being configured to transmit the written data to the plurality of data storage units and transmit the check data to the plurality of check bit storage units;
   wherein a first transmission time duration of the check data is shorter than a second transmission time duration of the written data, the first transmission time duration being a time duration required for transmitting the check data from the data transmission module to the plurality of check bit storage units, and the second transmission time duration being a time duration required for transmitting the written data from the data transmission module to the plurality of data storage units;
   wherein the check module comprises a first check unit and a second check unit, the data transmission module comprising a first transmission unit and a second transmission unit, one of two of the plurality of storage units positioned in adjacent columns being connected to the first check unit via the first transmission unit, and the other one of two of the plurality of storage units being connected to the second check unit via the second transmission unit.

2. The semiconductor memory according to claim 1, wherein a first transmission path of the check data is shorter than a second transmission path of the written data, the first transmission path being a path between the data transmission module and each of the plurality of check bit storage units, and the second transmission path being a path between the data transmission module and each of the plurality of data storage units; and
   wherein the first transmission path corresponds to the first transmission time duration, and the second transmission path corresponds to the second transmission time duration.

3. The semiconductor memory according to claim 2, wherein the check data comprises error correction check data, the written data and the error correction check data both comprising a plurality of data bits, and number of data bits of the written data being more than number of data bits of the error correction check data, the check module comprising:
   an error correction check unit, connected to the data transmission module, the error correction check unit being configured to generate the error correction check data according to the written data;
   wherein data of one of the plurality of data bits are correspondingly stored in one of the plurality of data storage units or one of the plurality of check bit storage units, a transmission time duration required for the written data, configured for defining each of the plurality of data bits, to be transmitted from the data transmission module to a corresponding one of the plurality of data storage units being a data transmission time duration, and a transmission time duration required for the error correction check data, configured for defining each of the plurality of data bits, to be transmitted from the data transmission module to a corresponding one of the plurality of check bit storage units being a check transmission time duration.

4. The semiconductor memory according to claim 3, wherein the first transmission time duration is a maximum value among a plurality of check transmission time durations, the second transmission time duration being a minimum value of a plurality of data transmission time durations.

5. The semiconductor memory according to claim 3, wherein the first transmission time duration is an average value among a plurality of check transmission time durations, the second transmission time duration being an average value of a plurality of data transmission time durations.

6. The semiconductor memory according to claim 3, wherein the first transmission time duration is a maximum value among a plurality of check transmission time durations, the second transmission time duration being a maximum value among a plurality of data transmission time durations.

7. The semiconductor memory according to claim 2, wherein the check data comprise parity check data, the written data comprising a plurality of data bits, the parity check data comprising one data bit, and the check module comprising:
   a parity check unit, connected to the data transmission module, the parity check unit being configured to generate the parity check data according to the written data;
   wherein data of one of the plurality of data bits are correspondingly stored in one of the plurality of data storage units or one of the plurality of check bit storage units, a transmission time duration required for the written data, configured for defining each of the plurality of data bits, to be transmitted from the data transmission module to a corresponding one of the plurality of data storage units being a data transmission time duration, and a transmission time duration required for the parity check data, configured for defining each of the plurality of data bits, to be transmitted from the data transmission module to a corresponding one of the plurality of check bit storage units being a check transmission time duration.

8. The semiconductor memory according to claim 7, wherein the first transmission time duration is the check transmission time duration, the second transmission time duration being a minimum value among a plurality of data transmission time durations.

9. The semiconductor memory according to claim 2, wherein a differential between the first transmission time duration and the second transmission time duration is greater than a preset time duration, the preset time duration being a time duration required for generating the check data by the check module based on the written data.

10. The semiconductor memory according to claim 9, wherein the preset time duration ranges from 0.5 ns to 1 ns.

11. The semiconductor memory according to claim 1, further comprising:
a plurality of bit line pairs, each of the plurality of bit line pairs comprising a first bit line and a second bit line, the first bit line and the second bit line being configured to transmit opposite signals, and the plurality of storage units positioned in the same column being connected to the same one of the plurality of bit line pairs;
a plurality of local data line pairs, each of the plurality of local data line pairs comprising a first local data line and a second local data line, and the first local data line and the second local data line being configured to transmit opposite signals; and
a plurality of sense amplifiers, each of the plurality of sense amplifiers being respectively connected to one of the plurality of bit line pairs and one of the plurality of local data line pairs;
wherein two storage units positioned in the adjacent columns are respectively connected to different local data line pairs among the plurality of local data line pairs via a corresponding one of the plurality of bit line pairs and a corresponding one of the plurality of sense amplifiers.

12. The semiconductor memory according to claim 11, further comprising:
a plurality of global data line pairs, each of the plurality of global data line pairs comprising a first global data line and a second global data line, and each of the plurality of global data line pairs respectively corresponding to the plurality of local data line pairs; and
a plurality of read-write conversion circuits, each of the plurality of read-write conversion circuits being respectively connected to the plurality of global data line pairs and one of the plurality of local data line pairs, the plurality of read-write conversion circuits being configured to convert a data transmission direction between the plurality of global data line pairs and the plurality of local data line pairs.

13. The semiconductor memory according to claim 1, comprising two storage arrays.

14. The semiconductor memory according to claim 13, further comprising:
at least one column decoding circuit, the at least one column decoding circuit being correspondingly connected to the at least one storage array; and
a row decoding circuit, respectively connected to the two storage arrays;
wherein the column decoding circuit and the row decoding circuit are jointly configured to decode an address signal to select the at least one storage array to be written.

15. The semiconductor memory according to claim 13, wherein the data transmission module is configured to synchronously transmit the written data to the two storage arrays; or
the data transmission module is configured to asynchronously transmit the written data to the two storage arrays.

16. The semiconductor memory according to claim 13, wherein a storage array close to the data transmission module is configured to store 128 bits of written data and 16 bits of check data, a storage array far away from the data transmission module being configured to store 128 bits of written data.

17. A method for writing data, comprising:
obtaining written data, and transmitting the written data to a check module;
transmitting the written data to a data storage unit via a data transmission module, the data transmission module being respectively connected to the check module and the data storage unit; and
generating check data according to the written data, and transmitting the check data to a check bit storage unit, the data transmission module being respectively connected to the check bit storage unit;
wherein a first transmission time duration of the check data is shorter than a second transmission time duration of the written data, the first transmission time duration being a time duration required for transmitting the check data from the data transmission module to the check bit storage unit, and the second transmission time duration being a time duration required for transmitting the written data from the data transmission module to the data storage unit;
wherein the check module comprises a first check unit and a second check unit, the data transmission module comprising a first transmission unit and a second transmission unit, one of two of a plurality of storage units positioned in adjacent columns being connected to the first check unit via the first transmission unit, and the other one of two of the plurality of storage units being connected to the second check unit via the second transmission unit.

* * * * *